(12) United States Patent
Shinoda et al.

(10) Patent No.: US 6,301,295 B1
(45) Date of Patent: Oct. 9, 2001

(54) AM MODULATED WAVE ELIMINATING CIRCUIT

(75) Inventors: Atsushi Shinoda, Sagamihara; Kenichi Shiraishi, Yokohama, both of (JP)

(73) Assignee: Kabushiki Kaisha Kenwood, Tokyo (JP)

( * ) Notice: Subject to any disclaimer, the term of this patent is extended or adjusted under 35 U.S.C. 154(b) by 0 days.

(21) Appl. No.: 09/257,048

(22) Filed: Feb. 25, 1999

(30) Foreign Application Priority Data

Feb. 26, 1998 (JP) .................................................. 10-060392
May 18, 1998 (JP) .................................................. 10-151890

(51) Int. Cl.[7] .............................. H04L 27/06; H03D 1/00
(52) U.S. Cl. ......................... 375/216; 375/320; 329/348; 455/142
(58) Field of Search ................................... 375/216, 268, 375/320; 329/348; 455/142

(56) References Cited

U.S. PATENT DOCUMENTS

| 5,633,869 | * | 5/1997 | Carlin et al. | 375/340 |
| 5,878,089 | * | 3/1999 | Dapper et al. | 375/325 |
| 6,128,334 | * | 10/2000 | Dapper et al. | 375/216 |

* cited by examiner

*Primary Examiner*—Amanda T. Le
(74) *Attorney, Agent, or Firm*—Eric J. Robinson; Nixon Peabody LLP

(57) ABSTRACT

The present invention provides an AM modulated wave eliminating circuit which is capable of extracting a digital modulated wave by cancelling an AM modulated wave from an AM data multiplex modulated wave. A composite wave is composed of an AM carrier wave in-phase signal, an AM carrier wave reverse-phase signal and a digital modulated wave is extracted from an AM data multiplex modulated wave composed of an AM stereo modulated wave multiplexed with a digital modulated wave within the same frequency band, values corresponding to different phase deflection angles of an AM stereo output from a phase level generator (21) are multiplied by the AM carrier wave in-phase signal with multipliers (221 through 22n), multiplication outputs are added to the composite wave with adders (231 through 23n), a phase deflection angle corresponding to an output at a minimum level out of addition outputs is determined with a phase presumer (24), a value corresponding to a determined phase deflection angle is selected from an output of a phase level generator (21) with a phase level selector (25), a selected value is multiplied by an AM carrier wave in-phase signal component with a multiplier (26), a multiplication output is added to the composite wave with an adder (27) and an addition output is used as a digital modulated wave.

3 Claims, 7 Drawing Sheets

AM MODULATED WAVE ELIMINATING CIRCUIT

BACKGROUND OF THE INVENTION

1. Field of the Invention

The present invention relates to an AM modulated wave eliminating circuit which extracts a digital modulated wave by eliminating an AM modulated wave from an AM data multiplex modulated wave consisting of an AM stereo modulated wave multiplexed with a digital modulated wave.

2. Related Background Art

Japanese Laid-Open Patent Application No. 9-326836 discloses an AM data multiplex modulation system which multiplexes an AM modulated wave with a digital signal so as not to influence an AM synchronous detection wave output at AM synchronous detection.

The AM data multiplex modulation system mentioned above will be described with reference to FIG. 6 taking an example wherein modulation system uses the QPSK (four-phase PSK) modulation mode for a digital wave.

An analog signal wave such as a voice signal (hereinafter also referred to simply as a signal) is supplied to an AM modulator 31 and a carrier wave having a frequency fc is subjected to AM modulation with the signal wave. An AM modulated wave vAMt) output from the AM modulator 31 is expressed by the following Equation (1):

$$vAM(t) = \{1 + \kappa vm(t)\}\cos \omega ct \quad (1)$$

wherein an amplitude of the carrier wave is taken as 1, the reference symbol ωc(rad/s) represents an angular frequency of the carrier wave, the reference symbol κ designates a modulation degree and a reference symbol vm(t) denotes the signal wave.

Arrays of digital signals of I and Q which are generated by a QPSK baseband digital signal generator 32 will be represented as In and Qn. Let us assume that In=±1 and Qn=±1.

The output signal from the QPSK baseband digital signal generator 32 is split into two, one being input into a quadrature modulator 33 to which a carrier wave having a frequency (fc+fα is supplied for DC-AC modulation of a carrier wave having an angular frequency (ωc+ωα)(rad/s) with a complex signal array. An output signal vDH(t) from the quadrature modulator 33 is as expressed by the following Equation (2):

$$vDH(t) = In \cos(\omega c + \omega \alpha)t + Qn \sin(\omega c + \omega \alpha)t \quad (2)$$

On the other hand, the QPSK baseband digital signals which are output from the QPSK baseband digital signal generator 32 are supplied to a sign inverter 34 for conversion into (−In) and (−Qn). The QPSK baseband digital signals which are subjected to the signal inversion by the sign inverter 34 are supplied to a complex conjugater 35 and made conjugate in complex, whereby the sign of the Qn signal array of the QPSK baseband digital signals is inverted, whereby the signal arrays are converted into (−In) and (Qn). That is, the sign inverter 34 and the complex conjugater 35 invert a sign of components which have a vector deviation corresponding to dibits formed by the QPSK baseband digital signals and the same phase as that of a standard carrier wave.

The complex signal arrays which are made conjugate in complex by the complex conjugater 35 are input into a quadrature modulator 36 to which the carrier wave having the frequency (fc−fα) is supplied and the carrier wave having the angular frequency (fc−fα) (rad/s) is subjected to quadrature conversion with the complex signal array. An output signal vDL(t) from the quadrature modulator 36 is as expressed by the following Equation (3):

$$vDL(t) = -In \cos(\omega c - \omega \alpha)t + Qn \sin(\omega c - \omega \alpha)t \quad (3)$$

The output signals vDH(t) and vDL(t) expressed by the Equations (2) and (3) are added to each other with an adder 37, which provides an addition output of vD(t) expressed by the following Equation (4):

$$\begin{aligned}vD(t) &= vDH(t) + vDL(t) \\ &= In \cos(\omega c + \omega \alpha)t + Qn \sin(\omega c + \omega \alpha)t \\ &\quad -In \cos(\omega c - \omega \alpha)t + Qn \sin(\omega c - \omega \alpha)t \end{aligned} \quad (4)$$

The AM modulated wave vAM(t) and the digital modulated wave vD(t) are input for addition into an adder 38, which transforms the modulated waves expressed by the Equations (1) and (4) into an AM data multiplex modulated wave v(t) expressed by the following Equation (5):

$$\begin{aligned}v(t) &= vAM(t) + vD(t) \\ &= \{1 + \kappa vm(t)\}\cos \omega ct \\ &\quad + In \cos(\omega c + \omega \alpha)t + Qn \sin(\omega c + \omega \alpha)t \\ &\quad - In \cos(\omega c - \omega \alpha)t + Qn \sin(\omega - \omega \alpha)t \end{aligned} \quad (5)$$

A process to prepare the AM data multiplex modulation wave in the AM data multiplex wave modulation system is shown in FIG. 7, wherein the AM modulated wave output from the AM modulator 31 is indicated by a, the output signal from the quadrature modulator 36, that is, the digital modulated wave, is indicated by b and the output signal from the quadrature modulator 33, that is, the digital modulated wave is indicated by c. The digital modulated wave output from the adder 37 is a sum of the signals indicated by b and c in FIG. 7, and the AM multiplex modulated wave output from the adder 38 is indicated by d in FIG. 7.

The AM data multiplex wave modulation system does not influence an AM synchronous detection wave output at an AM synchronous detection of the AM data multiplex modulated wave since the digital modulated wave signals are multiplexed at a location of the frequency (fc+fα) and a location of the frequency (fc−fα) which are axially symmetrical with regard to the carrier wave fc on a frequency axis.

However, the AM data multiplex modulation system may adopt the AM stereo modulation mode in place of the digital modulation mode for the AM data multiplex modulation. When the digital modulation mode is replaced with the AM stereo modulator, the AM data multiplex modulation system is incapable of extracting a digital modulated wave since a phase modulated wave and a digital modulated wave have similar characteristics in an AM stereo modulated wave.

Furthermore, the modulation system described above does not permit taking out desired digital data at an optionally selected time at which data are multiplexed or at an optionally selected frequency band at which data are multiplexed since it multiplexes, at the same frequency band and at the same time, an AM modulated component and a data modulated component of an AM data multiplex modulated wave which is multiplexed with a digital modulated wave and modulated in the AM data multiplex modulation mode though the system modulates an amplitude of a carrier wave having a frequency fc by an analog signal wave with an AM modulator, and multiplexes the digital modulated signals at the location of the frequency (fc+fα) and the location of the frequency (fc−fα) which are axially symmetrical with regard to the carrier wave having the frequency fc on the frequency axis.

A primary object of the present invention is to provide an AM modulated wave eliminating circuit which is capable of extracting a digital modulated wave by cancelling an AM modulated wave from an AM data multiplex modulated wave.

The AM modulated wave eliminating circuit according to the present invention extracts a digital modulated wave by cancelling an AM modulated wave from an AM data multiplex modulated wave which is multiplexed with an AM stereo modulated wave and a digital modulated wave within the same frequency band of an AM stereo modulated wave, the AM modulated wave eliminating circuit comprising extracting means to extract a composite wave composed of an AM carrier wave in-phase signal, an AM carrier wave reverse-phase signal and a digital modulated wave from an AM data multiplex modulated wave, presuming means to presume a value on the basis of a phase modulated component of an AM stereo modulated wave from the composite wave, and operating means to multiply a presumed value on the basis of the phase modulated component by the AM carrier wave in-phase component and add the multiplication output to the composite wave, characterized in that an output of the operating means provides a digital modulated wave.

The AM modulated wave eliminating circuit according to the present invention extracts the composite wave composed of the AM carrier wave in-phase signal, the AM carrier wave reverse-phase signal and the digital modulated wave from the AM data multiplex modulated wave by the extracting means, presumes the value from the extracted composite wave on the basis of the phase modulated component of the AM stereo modulated wave by the presuming means, multiplies a presumed value on the basis of the phase modulated component of the AM stereo modulated wave by AM carrier wave in-phase component and adds the multiplication output to the composite wave, thereby providing a digital modulated wave.

Furthermore, the AM modulated wave eliminating circuit according to the present invention performs AM modulation of a carrier wave having a frequency fc with an analog signal wave, and eliminates an AM modulated wave from an AM data multiplex modulated wave composed of digital modulated wave signals multiplexed at a location of a frequency (fc+fα and a location of a frequency (fc−fα) which are axially symmetrical with regard to a frequency axis of the carrier wave having a frequency fc within a frequency band of the AM modulated wave, characterized in that it comprises A/D converter means which samples the AM data multiplex modulated wave with sampling pulses having a frequency four times as high as that of the carrier wave and performs A/D conversion of sampled signals, a sampling point exchanging circuit which exchanges a discrete value output subjected to the A/D conversion at a sampling point (4m:m=0, 1, 2, 3 . . . ) with a discrete value output subjected to the A/D conversion at a sampling point (4m+3) and exchanges a discrete value output subjected to the A/D conversion at a sampling point (4m+1) with a discrete value output subjected to the A/D conversion at a sampling point (4m+2), and an adder which adds the discrete value output exchanged by the sampling point exchanging circuit to a discrete value output subjected to the A/D conversion by the A/D converter means.

In the AM modulated wave eliminating circuit according to the present invention, the AM data multiplex modulated wave is sampled at the frequency four times as high as the frequency of the carrier wave and the sampled signals are subjected to the A/D conversion by the A/D converter means. When m=0, 1, 2, 3, . . . , the discrete value output subjected to the A/D conversion at the sampling point (4m) is exchanged with the discrete value output subjected to the A/D conversion at the sampling point (4m+3) and the discrete value output subjected to the A/D conversion at the sampling point (4m+1) is exchanged with the discrete value output subjected to the A/D conversion at the sampling point (4m+2), and the exchanged discrete value output is added to the discrete value output subjected to the A/D conversion by the A/D converter means. As a result, only a digital modulated wave is sampled from the addition output with the sampling pulse and provided as a discrete output value subjected to the A/D conversion, whereby an AM modulated wave is eliminated.

DETAILED DESCRIPTION OF THE PREFERRED EMBODIMENTS

Now, the AM modulated wave eliminating circuit according to the present invention will be described with reference to the preferred embodiments thereof.

Figure 1:
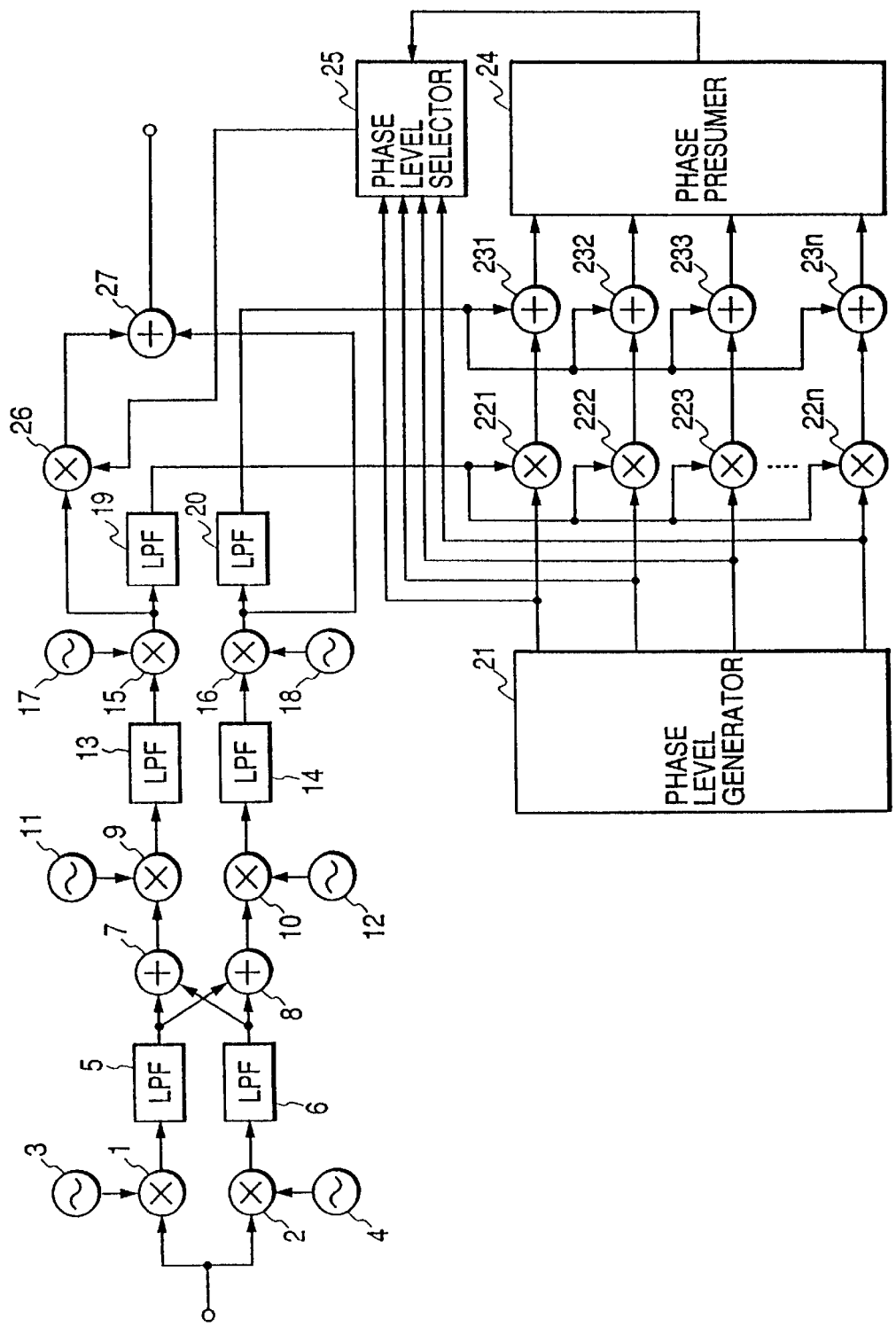
FIG. 1 is a block diagram illustrating a configuration of a first embodiment of the AM modulated wave eliminating circuit according to the present invention.

FIG. 1 is a block diagram illustrating a configuration of a first embodiment of the AM modulated wave eliminating circuit according to the present invention.

An input AM data multiplex modulated wave is supplied to a multiplier 1 and multiplied by an oscillation output of a local oscillator 3 having an angular frequency of ωc/2 (rad/s), and a multiplication output is supplied to a low pass filter 5, which eliminates high-pass components from the multiplication output. Similarly, the input AM data multiplex modulated wave is supplied to a multiplier 2 and multiplied by an oscillation output of a local oscillator 4 having an angular frequency of ωc/2 (rad/s), and a multiplication output is supplied to a low pass filter 6, which eliminates high-pass components from the multiplication output.

Each of the AM data multiplex modulated waves which are supplied to the multipliers 1 and 2 has been subjected to AM stereo modulation of the Motroller-type AM stereo modulation and is expressed by the following Equation (6):

$$v(t) = \{1 + \kappa vm(t)\} \cos(\omega_c t + \theta)$$
$$+ In \cos(\omega_c + \omega\alpha)t + Qn \sin(\omega_c + \omega\alpha)t$$
$$- In \cos(\omega_c - \omega\alpha)t + Qn \sin(\omega_c - \omega\alpha)t \quad (6)$$
$$\theta = \arctan\{vs(t)/(1 + \kappa vm(t))\}$$

The first term of the Equation (6) represents an AM stereo modulated wave, and the second and subsequent terms designate a digital modulated wave. In the Equation (6), the reference symbol $\kappa$ denotes a degree of AM modulation, the reference symbol $vm(t)$ denotes a monaural modulated wave, the reference symbol $vs(t)$ denotes a stereo modulated wave of the AM stereo modulated wave, the reference symbol $\omega_c$ denotes an angular frequency (rad/s) of an AM modulated carrier wave, the reference symbols In and Qn denote I and Q complex signal arrays of the QSPK baseband signal, and the reference symbol $\alpha$ denotes an angular frequency (rad/s) of a difference between a digital modulated carrier wave and an AM modulated carrier wave. The Equation (6) can be transformed into the following Equation (6a):

$$v(t) = \{1 + \kappa vm(t)\}(\cos \omega_c t \cdot \cos \theta - \sin \omega_c t \cdot \sin \theta)$$
$$- In \sin \omega_c t \cdot \sin \omega\alpha t + Qn \sin \omega_c t \cdot \cos \omega\alpha t$$
$$= [\{1 + \kappa vm(t)\} \cos \theta] \cos \omega_c t$$
$$+ [-\{1 + \kappa vm(t)\} \sin \theta - In \sin \omega\alpha t + Qn \cos \omega\alpha t]$$
$$\times \sin \omega_c t \quad (6a)$$

An AM multiplex modulated wave which has not been subjected to the AM stereo modulation is expressed by the Equation (5), which can be transformed into the following Equation (5a):

$$v(t) = \{1 + \kappa vm(t)\} \cos \omega_c t$$
$$- In \sin \omega_c t \cdot \sin \omega\alpha t + Qn \sin \omega_c t \cdot \cos \omega\alpha t$$
$$= \{1 + \kappa vm(t)\} \cos \omega_c t$$
$$+ (-In \sin \omega\alpha t + Qn \cos \omega\alpha t) \cdot \sin \omega_c t \quad (5a)$$

By comparing the Equation (6a) with the Equation (5a), it will be understood that the modulated waves expressed by these Equations are composed of AM stereo modulated waves and digital modulated waves which have a center frequency fc (Hz) and perpendicularly intersect with each other. However, the AM modulated wave intersects with the digital modulated wave completely perpendicularly in case of the AM multiplex modulated wave expressed by the Equation (5a), whereas the AM stereo phase modulated wave is overlapped with the digital modulated wave in case of the AM data multiplex modulated wave subjected to the AM stereo modulation, that is, the wave expressed by the Equation (6a). Accordingly, the presence of the AM stereo phase modulated wave makes it difficult to take out only the digital modulated wave as already described above.

Speaking again of the AM modulated wave eliminating circuit preferred as the first embodiment of the present invention, the AM data multiplex modulated wave expressed by the above-mentioned Equation (6) is multiplied in the multiplier 1 by the oscillation output $\cos(3/2)\omega_c t$ from the local oscillator 3, the high-pass frequency components are eliminated from a multiplication result and the low pass filter 5 sends out a signal expressed by the following Equation (7):

$$2\{v(t) \cos(3/2)\omega_c t\}$$
$$= (1 + M) \cos\{(-1/2)\omega_c t + \theta\}$$
$$+ In \cos\{(-1/2)\omega_c + \omega\alpha\}t + Qn \sin\{(-1/2)\omega_c + \omega\alpha\}t$$
$$- In \cos\{(-1/2)\omega_c - \omega\alpha\}t + Qn \sin\{(-1/2)\omega_c - \omega\alpha\}t$$
$$= (1 + M) \cos\{(1/2)\omega_c t - \theta\}$$
$$- In \cos\{(1/2)\omega_c + \omega\alpha\}t - Qn \sin\{(1/2)\omega_c + \omega\alpha\}t$$
$$+ In \cos\{(1/2)\omega_c - \omega\alpha\}t - Qn \sin\{(1/2)\omega_c - \omega\alpha\}t \quad (7)$$

wherein $M = \kappa vm(t)$.

Similarly, the AM data multiplex modulated wave expressed by the Equation (6) shown above is multiplied in the multiplier 2 by an oscillation output $\cos(1/2)\omega_c t$ from a local oscillator 4, high-pass frequency components are eliminated from a multiplication result and the low pass filter 6 sends out a signal which is expressed by the following Equation (8):

$$2\{v(t) \cos(1/2)\omega_c t\}$$
$$= (1 + M) \cos\{(1/2)\omega_c t + \theta\}$$
$$+ In \cos\{(1/2)\omega_c + \omega\alpha\}t + Qn \sin\{(1/2)\omega_c + \omega\alpha\}t$$
$$- In \cos\{(1/2)\omega_c - \omega\alpha\}t + Qn \sin\{(1/2)\omega_c - \omega\alpha\}t \quad (8)$$

An output from the low pass filter 5 and an output from the low pass filter 6 are supplied to an adder 7 for addition. The adder 7 provides an addition output expressed by an Equation (9) shown below. Furthermore, the outputs from the low pass filters 5 and 6 are supplied to an subtracter 8, which subtracts the output of the low pass filter 6 from the output of the low pass filter 5. The subtracter 8 provides a subtraction output expressed by an Equation (10) shown below:

$$(1 + M) \cos\{(1/2)\omega_c t - \theta\} + (1 + M) \cos\{(1/2)\omega_c t + \theta\}$$
$$= 2(1 + M) \cos(1/2)\omega_c t \cdot \cos \theta \quad (9)$$

$$(1 + M) \cos\{(1/2)\omega_c t - \theta\} - (1 + M) \cos\{(1/2)\omega_c t + \theta\}$$
$$2In \cos\{(1/2)\omega_c + \omega\alpha\}t - 2Qn \sin\{(1/2)\omega_c + \omega\alpha\}t$$
$$+ 2In \cos\{(1/2)\omega_c - \omega\alpha\}t - 2Qn \sin\{(1/2)\omega_c - \omega\alpha\}t$$
$$= -2(1 + M) \sin(1/2)\omega_c t \cdot \sin \theta$$
$$- 2In \cos\{(1/2)\omega_c + \omega\alpha\}t - 2Qn \sin\{(1/2)\omega_c + \omega\alpha\}t$$
$$+ 2In \cos\{(1/2)\omega_c - \omega\alpha\}t - 2Qn \sin\{(1/2)\omega_c - \omega\alpha\}t \quad (10)$$

wherein $\theta = 0$ at the monaural modulation, whereby the first term of the Equation (10) disappears and only the digital modulated wave remains.

An output from the adder 7 is supplied to a multiplier 9, which multiplies the output by an oscillation output of a local oscillator 11 having an angular frequency $\omega_c/2$ (rad/s) and a multiplication output is supplied to a low pass filter 13, which eliminates high-pass frequency components from the multiplication output. Similarly, an output from the subtracter 8 is supplied to a multiplier 10, which multiplies the output by an oscillation output from a local oscillator 12 having an angular frequency $\omega_c/2$ (rad/s) and a phase $\pi/2$ (rad) delayed from the oscillation output of the local oscillator 11 and a multiplication output is supplied to a low pass filter 14, which eliminates high-pass frequency components from the multiplication output.

That is, the output from the adder 7 is multiplied by an output $\cos(½)\omega ct$ from the local oscillator 11 and the low pass filter 13 provides an output which is expressed by an Equation (11) shown below. The output from the low pass filter 13 is supplied to a multiplier 15 and multiplied by an oscillation output from a local oscillator 17 having an angular frequency $\omega c/2$ (rad/s). The multiplier 15 provides an output which is expressed by an Equation (12) which is shown below:

$$2(1+M)\cos(½)\omega ct \cdot \cos\theta \cdot \cos(½)\omega ct$$

$$=(1+M)\cos\theta \cdot \cos\theta$$

$$=(1+M)\cos\theta \tag{11}$$

$$(1+M)\cos(½)\omega ct \cdot \cos\theta \tag{12}$$

As apparent from the Equation (12), an AM carrier wave in-phase signal is obtained from the multiplier 15.

On the other hand, the output from the subtracter 8 is multiplied by an output $\sin(½)\omega ct$ from the local oscillator 12, whereby the low pass filter 14 provides an output expressed by an Equation (13) shown below. The output from the low pass filter 14 is supplied to a multiplier 16 and multiplied by an oscillation output from a local oscillator 18 having an angular frequency $\omega c/2$ (rad/s). The multiplier 16 provides an output expressed by an Equation (14) shown below:

$$[-2(1+M)\sin(½)\omega ct \cdot \sin\theta$$

$$-2In\cos\{(½)\omega c+\omega\alpha\}t-2Qn\sin\{(½)\omega c+\omega\alpha\}t$$

$$+2In\cos\{(½)\omega c-\omega\alpha\}t-2Qn\sin\{(½)\omega c-\omega\alpha\}t]$$

$$\times\sin(½)\omega ct$$

$$=-(1+M)\cos\theta \cdot \sin\theta$$

$$+In\sin\omega\alpha t-Qn\cos\omega\alpha t-In\sin(-\omega\alpha)t-Qn\cos(-\omega\alpha)t$$

$$=-(1+M)\sin\theta+2In\sin\omega\alpha t-2Qn\cos\omega\alpha t \tag{13}$$

$$vamq(t)=\{-(1+M)\sin\theta+2In\sin\omega\alpha t-2Qn\cos\omega\alpha t\}$$

$$\times\cos(½)\omega ct$$

$$=-(1+M)\cos(½)\omega ct \cdot \sin\theta+2In\cos(½)\omega ct \cdot \sin\omega\alpha t$$

$$-2Qn\cos(½)\omega ct \cdot \cos\omega\alpha t$$

$$=-(1+M)\cos(½)\omega ct \cdot \sin\theta+In\sin\{(½)\omega c+\omega\alpha\}t$$

$$-Qn\cos\{(½)\omega c+\omega\alpha\}t-In\sin\{(½)\omega c-\omega\alpha\}t$$

$$-Qn\cos\{(½)\omega c-\omega\alpha\}t \tag{14}$$

As apparent from the formula (14) which represents an AM carrier wave reverse-phase signal by the first term and a digital modulated wave by the second and subsequent terms, the multiplier 16 provides a signal vamq, that is, "AM carrier wave reverse-phase signal+digital modulated signal".

Then, high-pass frequency components are eliminated by supplying the output from the multiplier 15, that is, the AM carrier wave in-phase signal, to a low pass filter 19 which is set at a cut-off frequency $fc(=\omega c/(2\pi))$ and feeding the output from the multiplier 16, that is, the vamq(t) reverse-phase signal, to a low pass filter 20 which is set at the cut-off frequency $fc(=\omega c/(2\pi))$. By passing the output through the low pass filter 20, the term $\{(½)\omega c+\omega\alpha\}t$ is eliminated from the Equation (14). In the Equations (12) and (14), variation rates of (1+M), $\cos\theta$, $\sin\theta$, In and Qn are extremely lower than those of $\cos(½)\omega ct$ and $\cos\{(½)\omega c-\omega\alpha\}t$. Therefore, values of former factors can be regarded as constants for a time on the order of a period of $\cos\{(½)\omega c-\omega\alpha\}t$.

On the other hand, a reference numeral 21 denotes a phase level generator which outputs a signal of constant $ki=\sin\theta i/\sin\theta i$ ($1\leq i\leq n$, $-(\pi/4)\leq\theta\leq(4/\pi)$). ($1\leq i\leq n$, $-(\pi/4)\leq\theta\leq 4/\pi$)) was adopted since the Motroller system adopts $\{-(\pi/4)\leq\theta\leq(4/\pi)\}$ as a maximum phase deviation angle of AM stereo.

The outputs ki from the phase level generator 21 are multiplied by outputs from the low pass filter 19 independently in multipliers 221, 222, 223 and 22n. Each of the multipliers 221, 222, 223, 22n provides an output which is expressed by the following Equation (12a):

$$(1+M)\cos(½)\omega ct \cdot \cos\theta \cdot \sin\theta i/\cos\theta i \tag{12a}$$

Adders 231, 232, 233 and 23n add the outputs from the multipliers 221, 222, 223 and 22n to an output from a low pass filter 20 which is expressed by the following Equation (14a):

$$-(1+M)\cos(½)\omega ct \cdot \sin\theta-In\sin\{(½)\omega c-\omega\alpha\}t$$

$$-Qn\cos\{(½)\omega c-\omega\alpha\}t \tag{14a}$$

Figure 2:
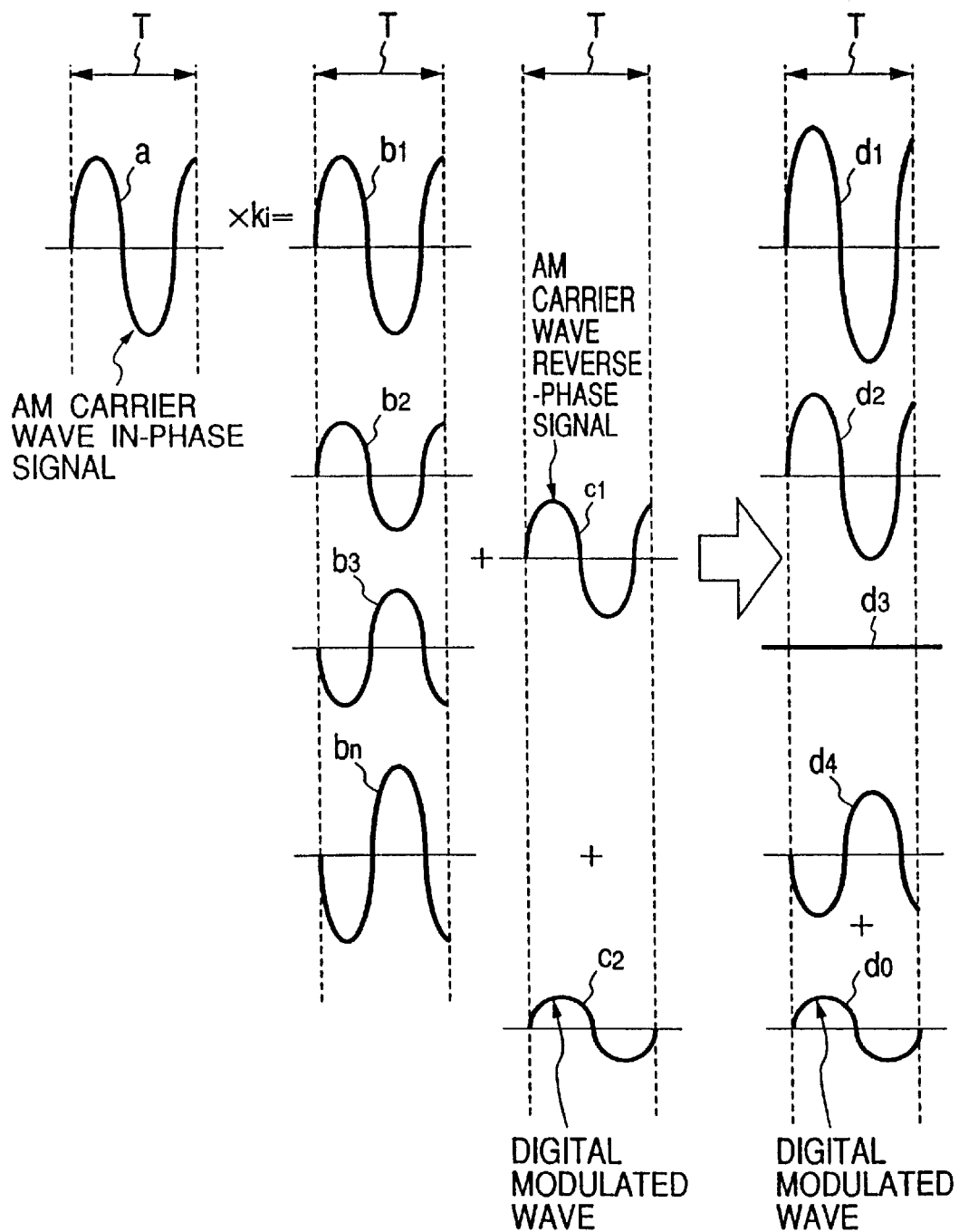
FIG. 2 is a schematic diagram descriptive of an assumption of a digital modulated signal selecting phase in the first embodiment of the AM modulated wave eliminating circuit according to the present invention.

In FIG. 2, a indicates a waveform of the AM carrier wave in-phase signal having passed through the filter 19 for a period T of $\cos\{(½)\omega c-\omega\alpha\}t$, whereas b1, b2, b3 and bn in FIG. 2 indicate waveforms of the outputs from the mulitipliers 221, 222, 223 and 22n for a period T of $\cos\{(½)\omega c-\omega\alpha\}t$ which are products of the waveform indicated by a in FIG. 2 multiplied by ki. A wave form output from the low pass filter 20 which is expressed by the Equation (14a), or a composite waveform consisting of the waveforms indicated by c1 and c2 in FIG. 2 is added to the waveforms indicated by b1, b2, b3 and bn in FIG. 2 by the adders 231, 232, 233 and 23n respectively. Though the waveforms indicated by c1 and c2 in FIG. 2 are actually composed into a single waveform, the waveforms are shown independently for convenience of description: c1 indicating a waveform of the AM carrier wave reverse-phase signal and c2 indicating a waveform of the digital modulated wave.

The adders 231, 232, 233 and 23n provide outputs having waveforms which are indicated by d1, d2, d3, dn and d0 in FIG. 2. Though the waveforms of the outputs from the adders 231, 232, 233 and 23n are actually composite waveforms which are obtained by synthesizing the waveforms indicated by d1, d2, d3 and dn with that indicated by d0, the waveforms are shown independently for convenience of description.

The addition outputs from the adders 231, 232, 233 and 23n are supplied to a phase presumer 24, which integrates the input waveforms for a period of $\cos\{(½)\omega c-\omega\alpha\}t$. Since this integration makes it possible to approximate variations of In and Qn for the time to "0", the digital modulated wave is cancelled, whereby the phase presumer 24 finds and outputs a point at which a signal having the cancelled digital modulated wave gives $\theta=\theta i$ as a point at which an input has a minimum value out of the inputs in a number of n. The minimum value of the input is apparent from a fact that [a value of the Equation (12a)–a value of the Equation (14a) in which the digital modulated wave is cancelled], that is, $(1+M)\cos(½)\omega ct \cdot \sin\theta-(1+M)\cos(½)\omega ct \cdot \sin\theta$ is "0" at $\theta=\theta i$.

The output from the phase presumer 24 is supplied to a phase level selector 25, which selects, out of outputs input into the phase level selector 25 from the phase level generator 21, an optimum phase level, that is, a phase level which is expressed by the following Equation (15):

$$\sin\theta/\cos\theta \qquad (15)$$

An output from the phase level selector 25 and the AM carrier wave in-phase signal are supplied to a multiplier 26 and multiplied by each other. As a result, the multiplier 26 outputs a signal expressed by the following Equation (16):

$$(1+M)\cos(\tfrac{1}{2})\omega ct \cdot \cos\theta \cdot \sin\theta/\cos\theta$$

$$=(1+M)\cos(\tfrac{1}{2})\omega ct \cdot \sin\theta \qquad (16)$$

The output from the multiplier 26 and (AM carrier wave reverse-phase signal+digital modulated wave) are input into an adder 27. As a result, the adder 27 outputs a signal expressed by the following Equation (17):

$$(1+M)\cos(\tfrac{1}{2})\omega ct \cdot \sin\theta + vamq(t)$$

$$=(1+M)\cos(\tfrac{1}{2})\omega ct \cdot \sin\theta - (1+M)\cos(\tfrac{1}{2})\omega ct \cdot \sin\theta + 2In\cos(\tfrac{1}{2})\omega ct \cdot \sin\omega\alpha$$

$$t - 2Qn\cos(\tfrac{1}{2})\omega ct \cdot \cos\omega\alpha t = 2In\cos(\tfrac{1}{2})\omega ct \cdot \sin\omega\alpha t - 2Qn\cos(\tfrac{1}{2})\omega ct \cdot \cos\omega\alpha t$$

$$=+2In\cos(\tfrac{1}{2})\omega ct \cdot \sin\omega\alpha t - 2Qn\cos(\tfrac{1}{2})\omega ct \cdot \cos\omega\alpha t$$

$$=2In\cos(\tfrac{1}{2})\omega ct \cdot \sin\omega\alpha t - 2Qn\cos(\tfrac{1}{2})\omega ct \cdot \cos\omega\alpha t \qquad (17)$$

Accordingly, the AM stereo modulated wave is cancelled in the output from the adder 27, whereby the adder 27 outputs the digital modulated wave.

Now, description will be made of a modification of the first embodiment of the AM modulated wave eliminating circuit according to the present invention.

The first embodiment of the present invention adopts the method to find the minimum value by cancelling the digital modulated wave. This method may be replaced with a method to search for a waveform containing a wave which is most likely to be a digital modulated wave during the presumption of a phase.

Figure 3:
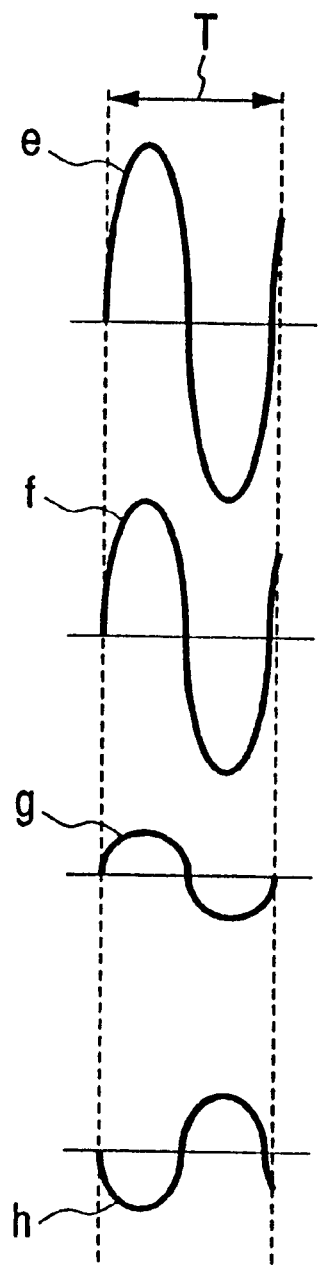
FIG. 3 is a schematic diagram descriptive of another example of the assumption of a digital modulated signal selecting phase in the first embodiment of the AM modulated wave eliminating circuit according to the present invention.

In FIG. 3, e through h indicate waveforms exemplifying waveforms which are actually input into the phase presumer 24 on the basis of the waveforms indicated by d1 through d0 in FIG. 2. Out of the waveforms indicated by e through h in FIG. 3, those indicated by e, f and h are sinusoidal waves which do not complete within a period T of $\cos\{(\tfrac{1}{2})\omega c - \omega\alpha\}t$, whereas that indicated by g in FIG. 3 is a clear sinusoidal wave. This sinusoidal wave signifies that only a digital modulated wave remains in the waveform and Ki of this waveform is a phase of an AM stereo to be determined.

Though $(\tfrac{3}{2})\omega c$ is taken as the oscillation angular frequency of the local oscillator 3 and $(\tfrac{1}{2})\omega c$ is taken as the angular frequency of the local oscillators 4, 11, 12, 17 and 18 in the description made above, it is possible to adopt different angular frequencies. When the oscillation angular frequency of $(\tfrac{3}{2})\omega c$ is represented by $\omega pf1$, the angular frequency of $(\tfrac{1}{2})\omega c$ is designated by $\omega pf2$ and $\omega pf1$ is higher than $\omega pf2$, it is sufficient to select a relationship which satisfies $\omega pf1 - \omega c = \omega c - \omega pf2$.

As understood from the foregoing description, the AM modulated wave eliminating circuit according to the present invention provides an effect to enable to extract a digital modulated wave by eliminating an AM modulated wave even in a case of an AM stereo modulation, thereby making it possible to demodulate digital modulated waves which could not conventionally be demodulated.

Figure 4:
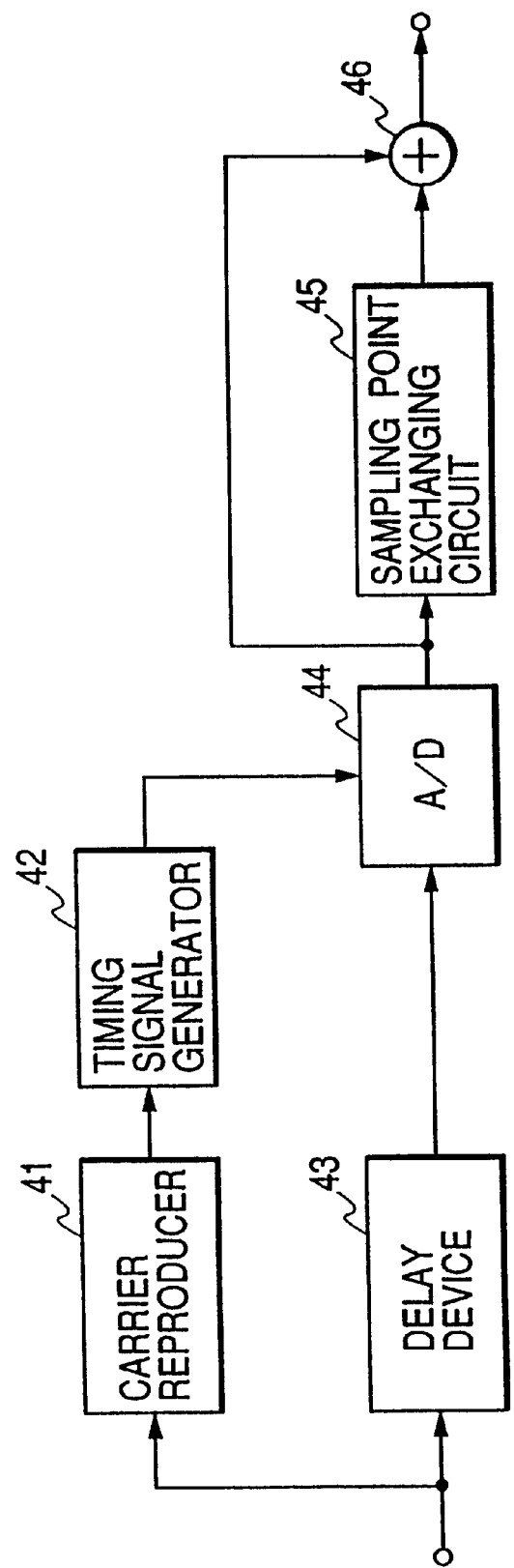
FIG. 4 is a block diagram illustrating a configuration of a second embodiment of the AM modulated wave eliminating circuit according to the present invention.

FIG. 4 is a block diagram illustrating a configuration of a second embodiment of the AM modulated wave eliminating circuit according to the present invention.

In the AM modulated wave eliminating circuit preferred as the second embodiment of the present invention, an input AM data multiplex modulated wave is supplied to a carrier reproducer 41, which reproduces an AM modulated carrier wave, and the AM modulated carrier wave reproduced by the carrier reproducer 41 is supplied to a timing signal generator 42, which generates a timing signal for A/D conversion. A timing signal which has a frequency four times as high as that of a carrier wave is generated as a sampling pulse. On the other hand, the input AM data multiplex modulated wave is supplied to a delay device 43, which delays this wave and an output from the delay device 43 is supplied to an A/D converter 44, which performs A/D conversion at a timing on the basis of the timing signal. An A/D conversion output provided from the A/D converter 43 is supplied, for exchange with another A/D conversion output, to a sampling point exchanging circuit 45 which exchanges an A/D conversion output subjected to the A/D conversion at a sampling point (4m : m=0, 1, 2, 3, . . . ) (a discrete value output) with an A/D conversion output subjected to the A/D conversion at a sampling point (4m+3) and exchanges an A/D conversion output subjected to the A/D conversion at a sampling point (4m+1) with an A/D conversion output subjected to the A/D conversion at a sampling point (4m+2), and the A/D conversion output from the A/D converter 44 and an output from the sampling point exchanging circuit 45 are supplied to an adder 46, which adds these outputs and sends out an addition output.

The AM data multiplex modulated wave v(t) expressed by the Equation (5) mentioned above can be transformed as expressed by the following Equation (6):

$$v(t)=\{1+\kappa vm(t)\}\cos\omega ct$$

$$+In\cos(\omega c+\omega\alpha)t+Qn\sin(\omega c+\omega\alpha)t$$

$$-In\cos(\omega c-\omega\alpha)t+Qn\sin(\omega c-\omega\alpha)t$$

$$=\{1+\kappa vm(t)\}\cos\omega ct$$

$$-2In\sin\omega ct\sin\omega\alpha t + 2Qn\cos\omega\alpha t\sin\omega ct \qquad (6)$$

The reference symbol $\omega\alpha$ denotes an angular frequency (rad/s) of a difference between a digital modulated carrier wave and the AM modulated carrier wave, and the digital modulated carrier wave exists in upper and lower side bands of the AM modulated carrier wave at locations which are symmetrical with each other and apart from each other for a frequency $f\alpha$. Furthermore, let us assume $fc >> f\alpha$.

In the AM modulated wave eliminating circuit preferred as the second embodiment of the present invention shown in FIG. 4, an AM data multiplex modulated wave expressed by the Equation (6) mentioned above is input into the carrier reproducer 41 and the delay device 43.

The input AM data multiplex modulated wave signal v(t) is input into the carrier reproducer 41 and the delay device 43. Description will be made first of carrier eave reproduction by the carrier reproducer 41. The carrier reproducer 41 reproduces a carrier wave for AM modulation and provides an output vc(t) which is expressed by the following Equation (7):

$$vc(t)=\cos\omega ct \qquad (7)$$

The signal vc(t) is input into the timing signal generator 42, which generates a timing signal for A/D conversion. In the second embodiment, the timing signal is output when the signal vc(t) of a single frequency has phases of $(\pi/4)$ radian, $(3\pi/4)$ radian, $(5\pi/4)$ radian and $(7\pi/4)$ radian. In other words, the timing signal is generated so that the AM data multiplex modulated signal v(t) is sampled by the A/D converter 44 at time t expressed by the following Equation (8):

$$t = 1+2m/8fc \qquad (8)$$

wherein m=0, 1, 2, 3, . . . , whereby a sampling frequency is 4fc (Hz).

On the other hand, the delay device 43 sends out the AM data multiplex modulated wave v(t) with a delay time which is a total sum of a delay time in the carrier reproducer 41 and that in the timing signal generator 42. Let us not to take the delay time into consideration and take a delay time in the delay device 43 as 0 for simplicity. Accordingly, a signal output from the delay device 43 is equal to the AM data multiplex modulated wave v(t), and is input into the A/D converter 44 and is sampled with the timing signal generated by the timing signal generator 42.

Therefore, the AM data multiplex modulated wave signal v(t) is sampled with the sampling pulse having a sampling frequency of 4fc (Hz) and subjected to A/D conversion by the A/D converter 44.

Accordingly, a discrete output signal vD(m) which is provided from the A/D converter 44 is as expressed by the following Equation (9):

$$vD(m) = \{1+Kvm(t)\}\cos 2\pi fc(1+2m)/8fc$$

$$-In\{\sin 2\pi fc(1+2m)/8fc\}\{\sin 2\pi f\alpha(1+2m)/8fc\}$$

$$+Qn\{\sin 2\pi fc(1+2m)/8fc\}\{\cos 2\pi f\alpha(1+2m)/8fc\}$$

$$= \{1+Kvm(t)\}\cos(1+2m)\pi/4$$

$$-In \sin(1+2m)\pi/4 \cdot \sin(1+2m)\pi f\alpha/4fc$$

$$+Qn \sin(1+2m)\pi/4 \cdot \cos(1+2m)\pi f\alpha/4fc$$

$$= \{1+Kvm(t)\}\cos(1+2m)\pi/4$$

$$+[-In \sin(1+2m)\pi f\alpha/4fc$$

$$+Qn \cos(1+2m)\pi f\alpha/4fc] \cdot \sin(1+2m)\pi/4 \qquad (9)$$

Then, description will be made of exchanging processes in the sampling point exchanging circuit 45. This circuit exchanges sampling points in a manner: m=0→←m=3, m=1→←m=2, m=4→←m=7, m=5→←m=6, . . . . The symbols →← indicate mutual exchange of sampling points. That is, the sampling point exchanging circuit 45 exchanges the sampling points with each other as indicated by (4m)→←(4m+3) and (4m+1)→←(4m+2) at m=0, 1, 2, 3, . . .

Since the condition of fc>>fα makes variations of a value of {1+Kvm(t)} and that of [-In sin(1+2m)πfα/4fc+Qn cos (1+2m)πfα/4fc] in the Equation (9) remarkably slower than those of a value of cos(1+2m)π/4 and a value of sin(1+2m) π/4, it is possible in the second embodiment that the values of the former terms remain unchanged regardless of the exchange of the sampling points.

In the Equation (9), cos(1+2m)π/4=1/√2 and sin (1+2m) π/4=1/√2 at m=0, 4, 8, . . . , $$\cos(1+2m)\pi/4 = 1/\sqrt{2} \text{ and } \sin(1+2m)\pi/4 = -1/\sqrt{2} \text{ at } m=1, 5, 9, \ldots$$

$$\cos(1+2m)\pi/4 = -1/\sqrt{2} \text{ and } \sin(1+2m)\pi/4 = -1/\sqrt{2} \text{ at } m=2, 6, 10, \ldots, \text{ and}$$

$$\cos(1+2m)\pi/4 = -1/\sqrt{2} \text{ and } \sin(1+2m)\pi/4 = 1/\sqrt{2} \text{ at } m=3, 7, 11, \ldots$$

Therefore, the exchange of the sampling points described above (m=0→←m=3, m=1→←m=2, m=4→←m=7, m=5→←m=6, . . . ) changes a sign only of cos(1+2m)π/4 but does not change a sign of sin(1+2m)π/4, whereby the sampling point exchanging circuit 45 provides an output expressed by the following Equation (10):

$$-\{1+Kvm(t)\}\cos(1+2m)\pi/4$$

$$+[-In \sin(1+2m)\pi f\alpha/4fc$$

$$+Qn \cos(1+2m)\pi f\alpha/4fc] \cdot \sin(1+2m)\pi/4 \qquad (10)$$

The fact that the exchange of the sampling points does not cause changes of the values will be described with reference to schematic diagrams shown in FIGS. 5A through 5I.

Figures 5A, 5B, 5C, 5D, 5E, 5F, 5G, 5H, 5I:
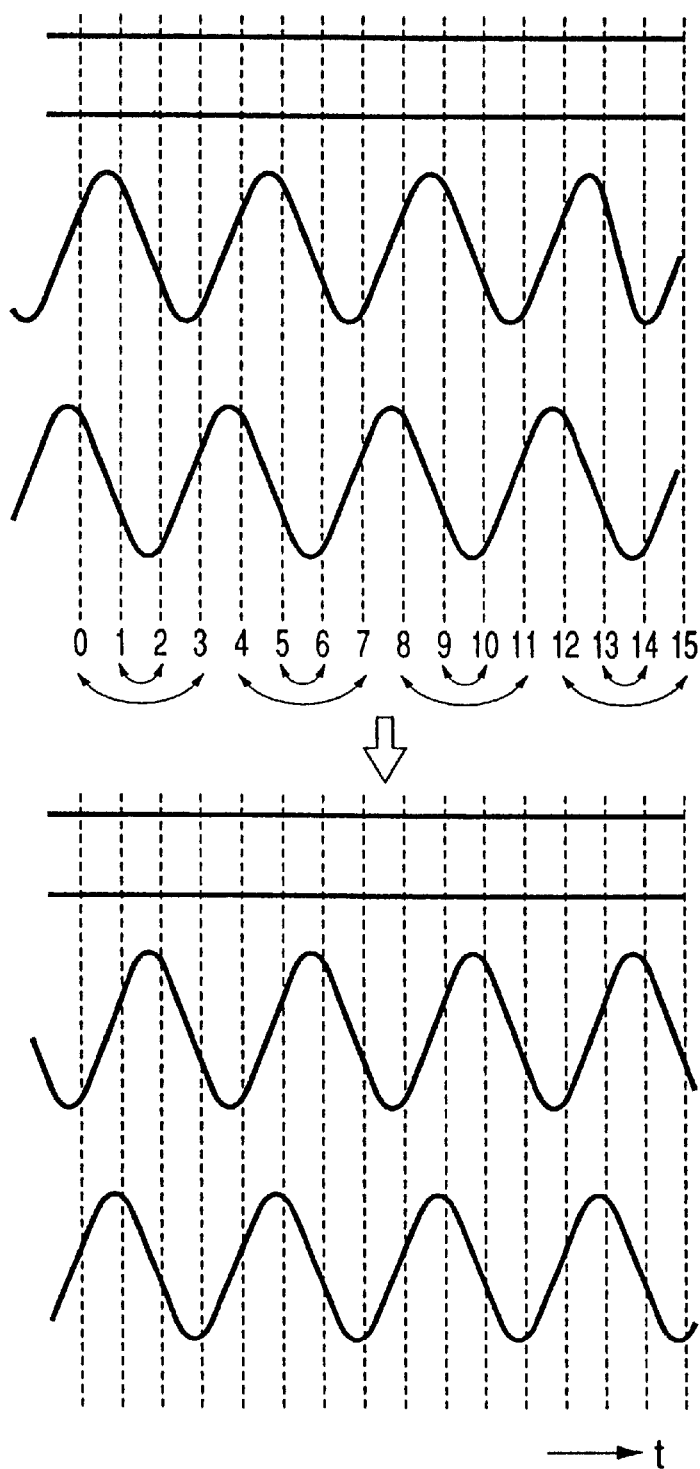
FIGS. 5A through 5I are schematic diagrams descriptive of functions of the second embodiment of the AM modulated wave eliminating circuit according to the present invention.

{1+kvm(t)} varies as shown in FIG. 5A in which a scale in a direction of amplitude is larger than an actual scale and {-In sin(1+2m)πfα/4fc+Qn cos(1+2m)πfα/4fc] varies as shown in FIG. 5B in which a scale in the direction of amplitude is larger than the actual scale. In contrast, cos(1+2m)π/4 varies as shown in FIG. 5C and sin(1+2m)π/4 varies as shown in FIG. 5D. FIG. 5E shows sampling points which are numbered as 0, 1, 2, 3, . . . .

Corresponding to the variations described above, sampling points for the AM data multiplex modulated wave signal v(t) are exchanged with each other as indicated by →← in FIG. 5E. Since {1+Kvm(t)} varies little as shown in FIG. 5A, its value remains substantially unchanged as shown in FIG. 5F regardless of the exchange of the sampling points. Furthermore, since [-In sin(1+2m)πfα/4fc+Qn cos (1+2m)πfα/4fc] varies little as shown in FIG. 5B, its value remains substantially unchanged as shown in FIG. 5G regardless of the exchange of the sampling points.

In contrast, -cos(1+2m)π/4 varies as shown in FIG. 5H and sin(1+2m)π/4 varies as shown in FIG. 5I. The sign of cos(1+2m)π/4 has been made negative as already described above.

Then, the output from the A/D converter 44 expressed by the Equation (8) and the output from the sampling point exchanging circuit 45 expressed by the Equation (10) are added by an adder 46, which provides an output expressed by the following Equation (11):

$$2[-In \sin(1+2m)\pi f\alpha/4fc$$

$$+Qn \cos(1+2m)\pi f\alpha/4fc] \cdot \sin(1+2m)\pi/4 \qquad (11)$$

The output from the adder 46 expressed by the Equation (11) is a signal consisting only of a digital modulated wave which is sampled at the sampling frequency of 4fc (Hz). Accordingly, the adder 46 outputs a signal prepared by eliminating the AM modulated wave from the AM data multiplex modulated wave and the baseband digital data can be demodulated from this signal.

As understood from the foregoing description, the AM modulated wave eliminating circuit according to the present invention is capable of eliminating an AM modulated wave from an AM data multiplex modulated wave with a simple and small configuration.

FIG. 1

21 Phase level generator

24 Phase presumer

25 Phase level selector

Figure 6:
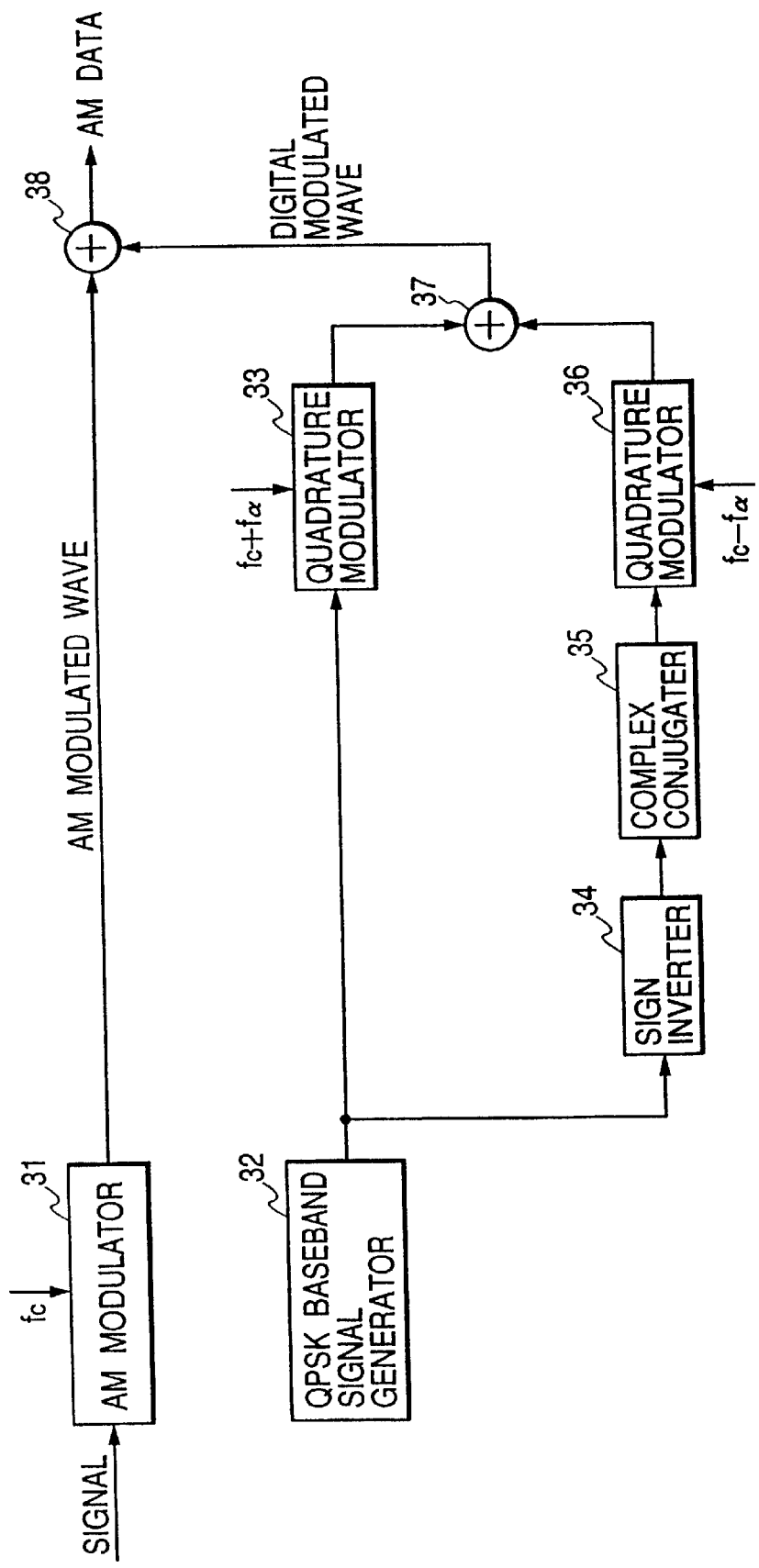
FIG. 6 is a block diagram illustrating a configuration of an AM data multiplex modulation system.
Figure 7:
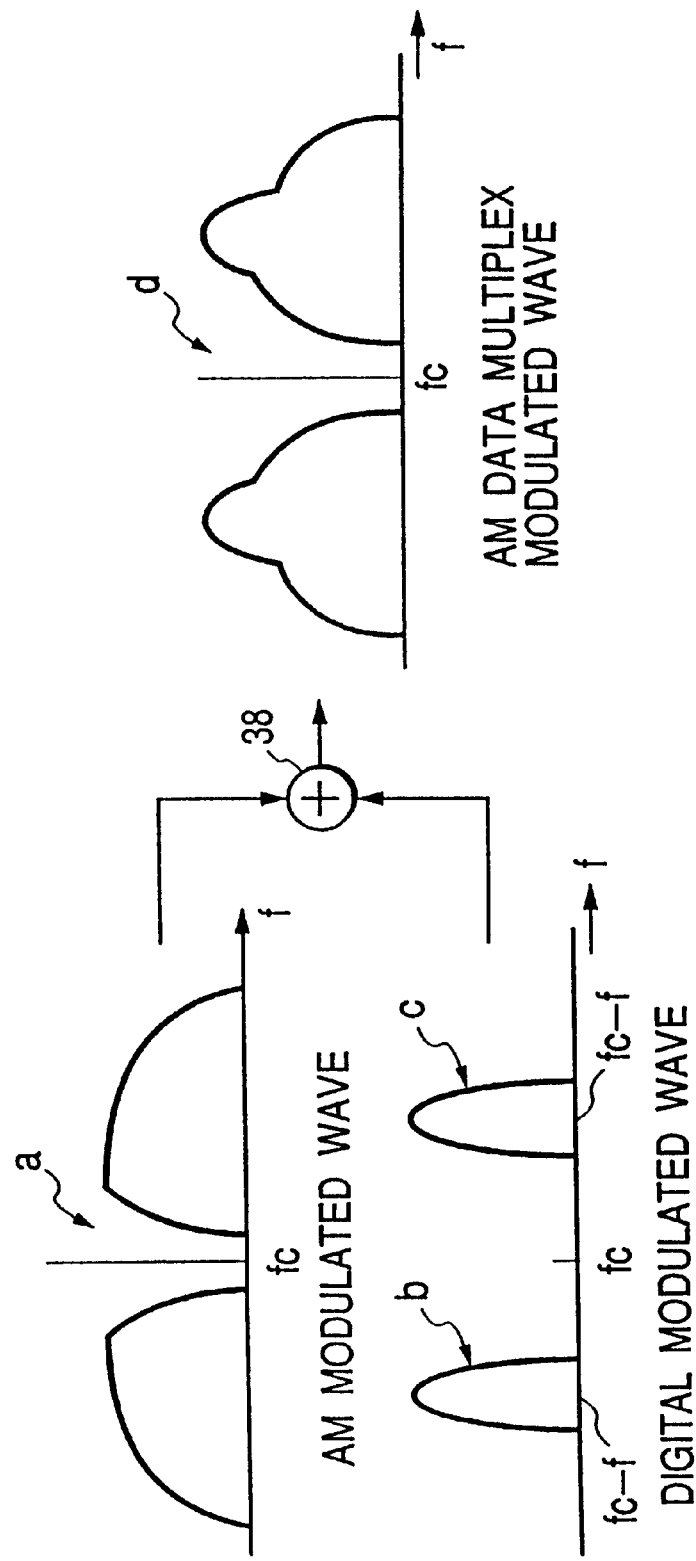
FIG. 7 is a schematic diagram descriptive of multiplexing in the AM data multiplex modulation system.

FIG. 2 a AM carrier wave in-phase signal c1 AM carrier wave reverse-phase signal c2 Digital modulated wave d0 Digital modulated wave FIG. 4
41 Carrier regenerator
42 Timing signal generator
43 Delay device
45 Sampling point exchanging circuit
FIG. 6
31 AM modulator
32 QPSK baseband signal generator
33 D/A modulator
34 Sign inverter
35 Complex conjugater
36 D/A modulator
1 Signal
2 AM modulator
3 AM data multiplex modulated wave
4 Digital modulated wave
FIG. 7
1 AM modulated wave
2 Digital modulated wave
3 AM data multiplex modulated wave

What is claimed is:

1. An AM modulated wave eliminating circuit for extracting a digital modulated wave by eliminating an AM modulated wave from an AM data multiplex modulated wave composed of an AM stereo modulated wave multiplexed with the digital modulated wave comprising:

extracting means for extracting a composite wave composed of an AM carrier wave in-phase signal, an AM carrier wave reverse-phase signal and a digital modulated wave from an AM data multiplex modulated wave;

presuming means for presuming a value on the basis of a phase modulated wave component of the AM stereo modulated wave from said composite wave; and means for adding an output obtained by multiplying a presumed value on the basis of said phase modulated wave component by said AM carrier wave in-phase signal to said composite wave, wherein an addition output is obtained as a digital modulated wave.

2. The AM modulated wave eliminating circuit according to claim 1, wherein said presuming means multiplies values corresponding to different phase deflection angles of an AM stereo by the AM carrier wave in-phase signal, adds multiplication outputs to the composite wave and selects a value which corresponds to a phase deviation angle corresponding to an output at a minimum level out of addition outputs.

3. An AM modulated wave eliminating circuit for eliminating an AM modulated wave from an AM data multiplex modulated wave multiplexed with a digital modulated wave signal comprising:

A/D converter means for sampling the AM data multiplex modulated wave with sampling pulses having a frequency four times as high as a carrier wave frequency and performs A/D conversion of sampled signals;

a sampling point exchanging circuit which exchanges, taking m=0, 1, 2, 3, . . . , a discrete value output subjected to the A/D conversion at a sampling point (4m) with a discrete value output subjected to the A/D conversion at a sampling point (4m+3) and exchanges a discrete value output subjected to the A/D conversion at a sampling point (4m+1) with a discrete value output subjected to the A/D conversion at a sampling point (4m+2);

and an adder which adds the discrete value output exchanged by the sampling point exchanging circuit to a discrete value output subjected to the A/D conversion by the A/D converter means, wherein an output from said adder is a digital modulated wave which is prepared by eliminating the AM modulated wave from the AM multiplex modulated wave.

* * * * *